United States Patent
Wang et al.

(10) Patent No.: US 7,831,947 B2
(45) Date of Patent: Nov. 9, 2010

(54) SEMICONDUCTOR LAYOUT DESIGN APPARATUS, SEMICONDUCTOR LAYOUT DESIGN METHOD AND COMPUTER READABLE MEDIUM

(75) Inventors: Shen Wang, Yokohama (JP); Tetsuaki Utsumi, Kawasaki (JP); Mizue Sekine, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 381 days.

(21) Appl. No.: 11/941,739

(22) Filed: Nov. 16, 2007

(65) Prior Publication Data

US 2008/0134120 A1 Jun. 5, 2008

(30) Foreign Application Priority Data

Nov. 17, 2006 (JP) ............................. 2006-312007

(51) Int. Cl.
*G06F 17/50* (2006.01)
(52) U.S. Cl. ...................... 716/10; 716/7; 716/8; 716/9
(58) Field of Classification Search .................... 716/2, 716/7, 8, 9, 10
See application file for complete search history.

(56) References Cited

U.S. PATENT DOCUMENTS

| 6,154,873 A | 11/2000 | Takahashi |
| 6,560,505 B1 | 5/2003 | Kikuchi et al. |
| 2004/0093576 A1 | 5/2004 | Terasawa et al. |

FOREIGN PATENT DOCUMENTS

| JP | 06-244280 | 9/1994 |
| JP | 2006-190062 | 7/2006 |

*Primary Examiner*—Sun J Lin
(74) *Attorney, Agent, or Firm*—Turocy & Watson, LLP

(57) ABSTRACT

A semiconductor layout design apparatus has an inter-block connection information extracting part, a block global placement part and a cell placement setting part. The inter-block connection information extracting part configured to extract the number of wiring connections between a plurality of blocks including standard cells and macrocells based on a net list, library information, floor plan information and technology information. The block global placement part configured to roughly place the plurality of blocks in a placement region on a semiconductor substrate. The cell placement setting part configured to set placement positions of the macrocells in the block based on a positioning relationship with the other block and the number of the wiring connections with the other block with respect to each of the plurality of blocks roughly placed by the block global placement part.

20 Claims, 10 Drawing Sheets

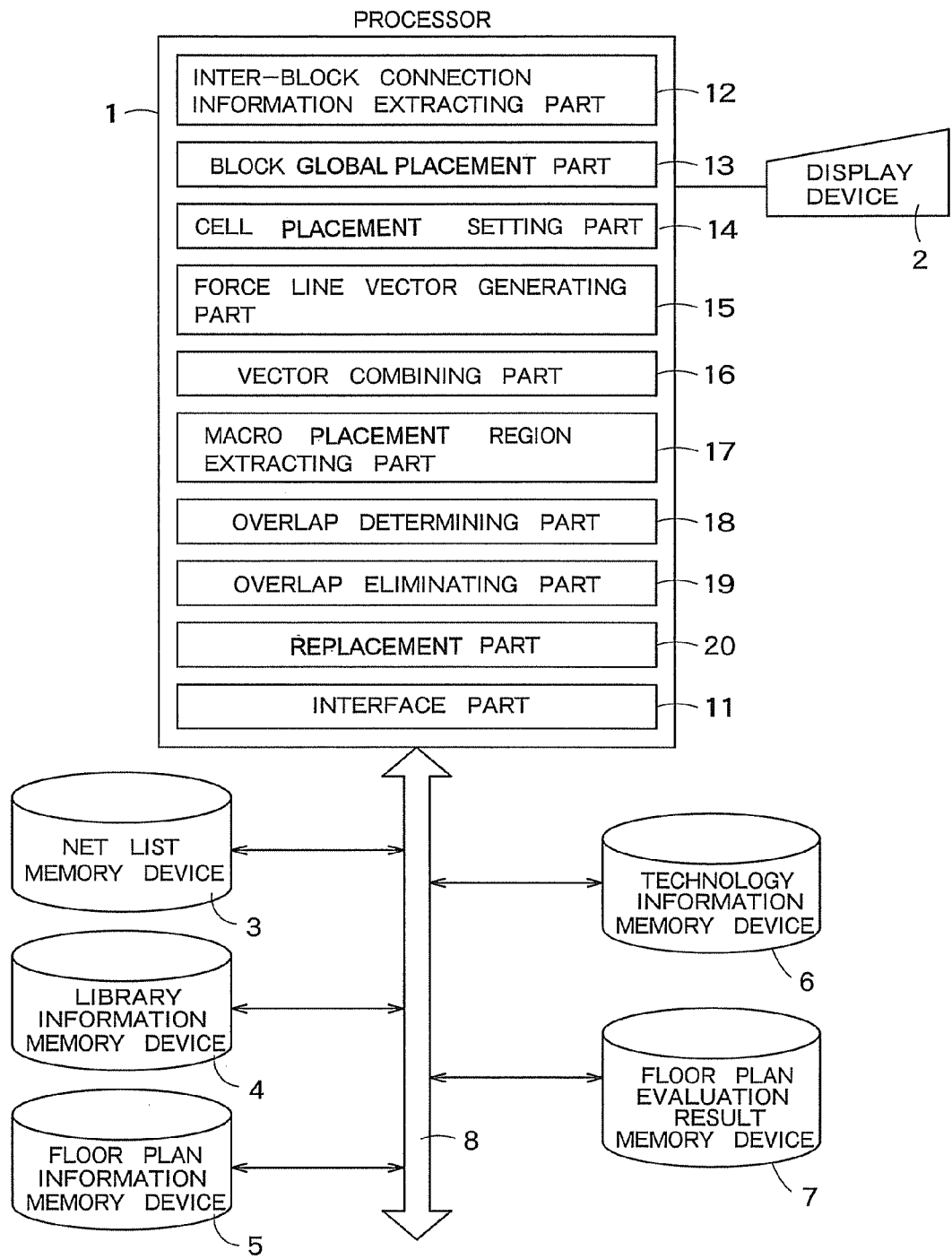
F I G. 1

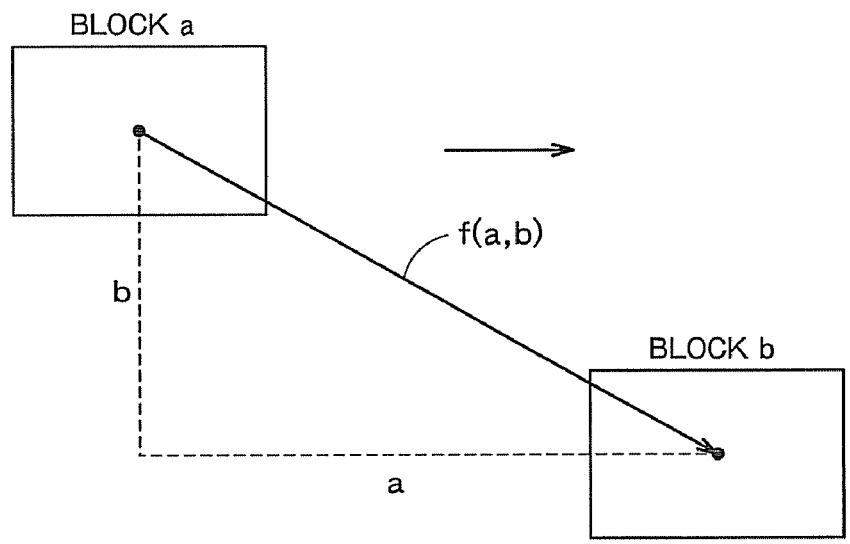
F I G. 3
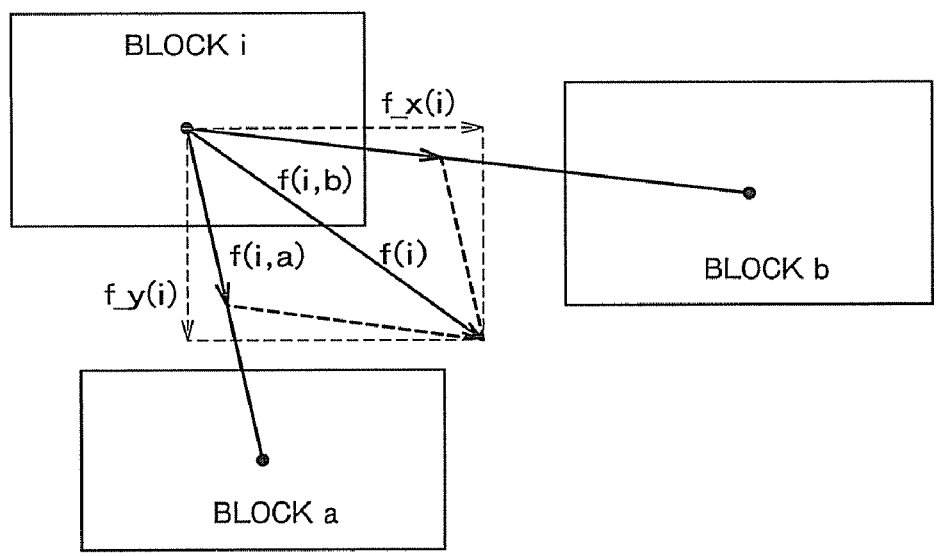
F I G. 4

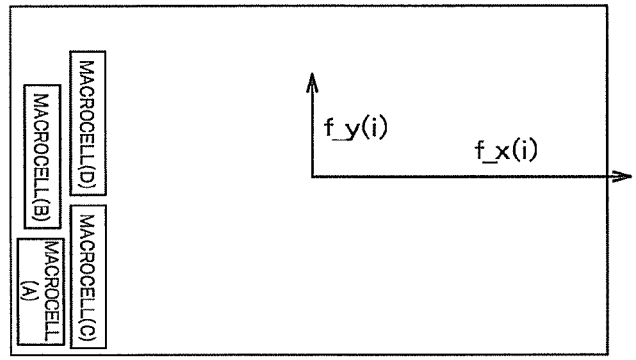
F I G. 5
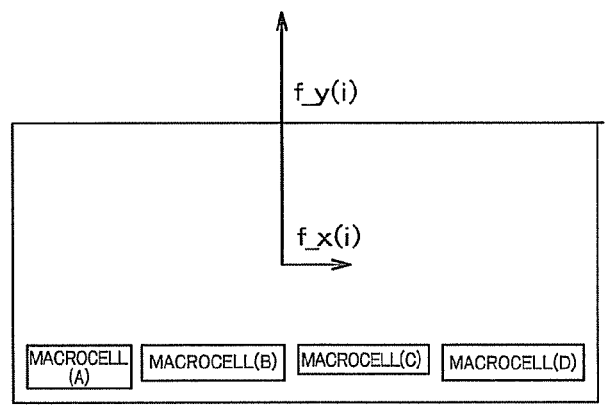
F I G. 6
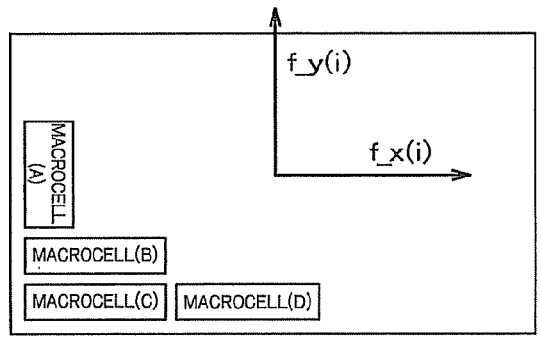
F I G. 7

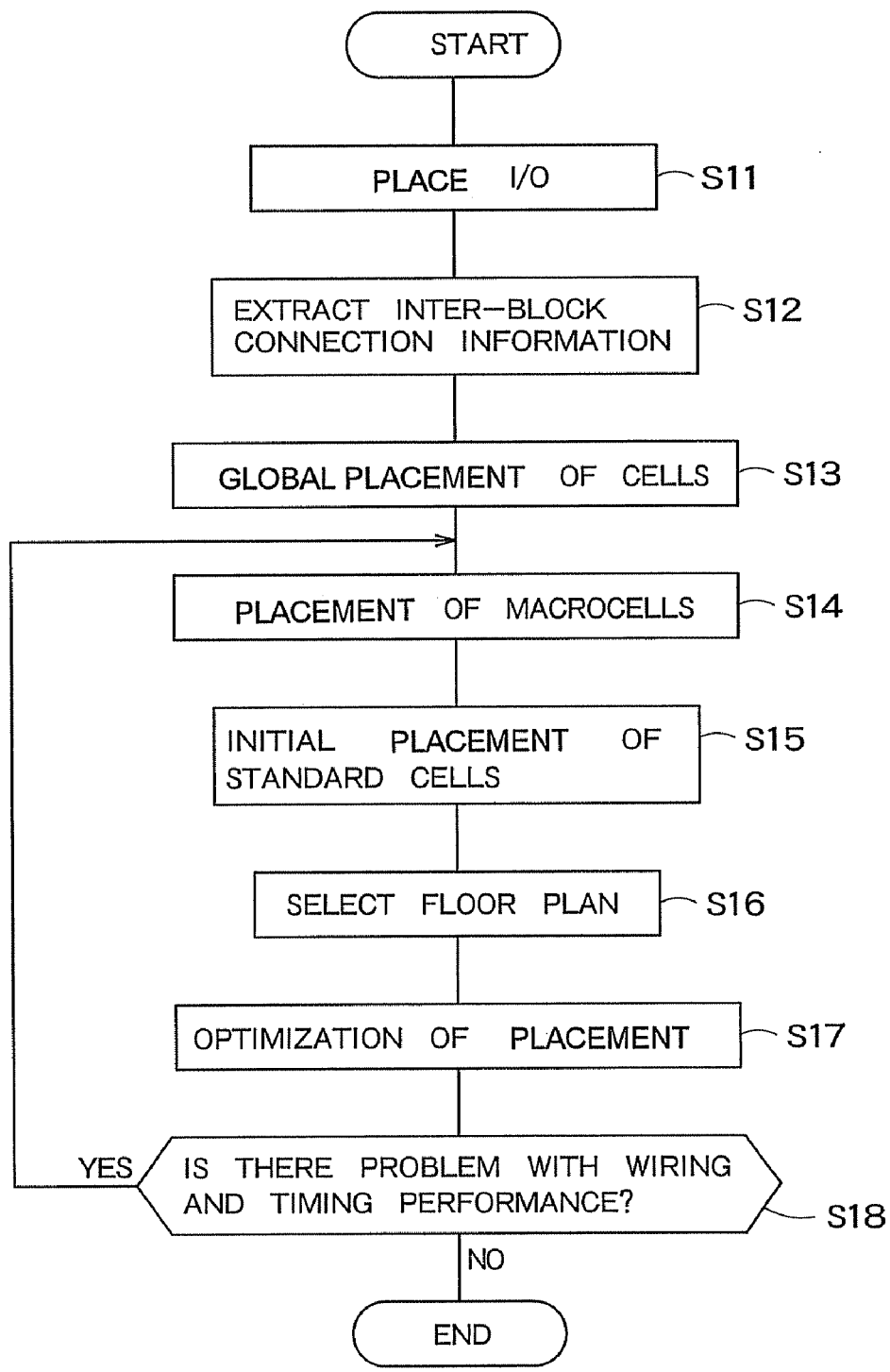
F I G. 8

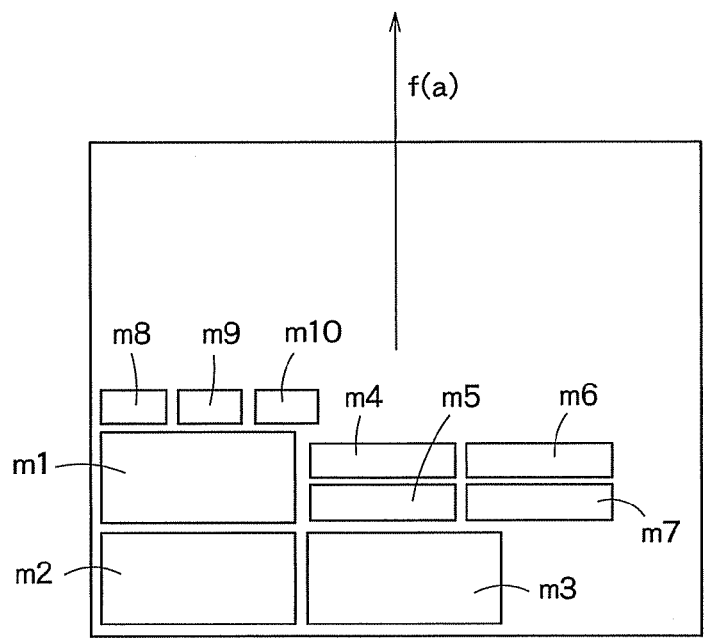
F I G. 10A
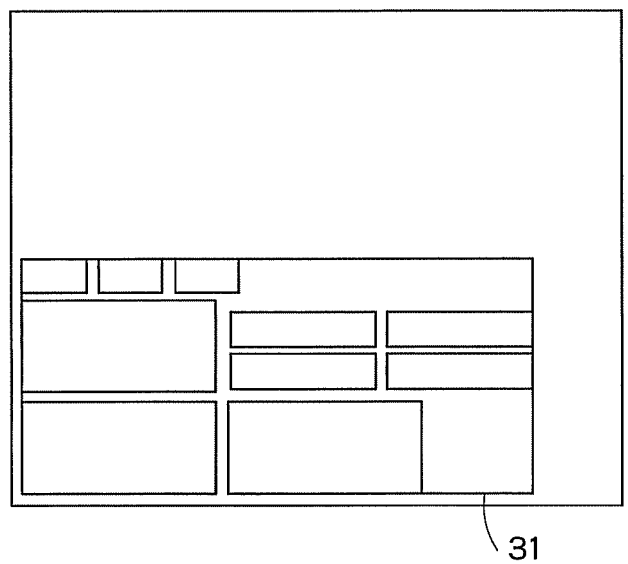
F I G. 10B

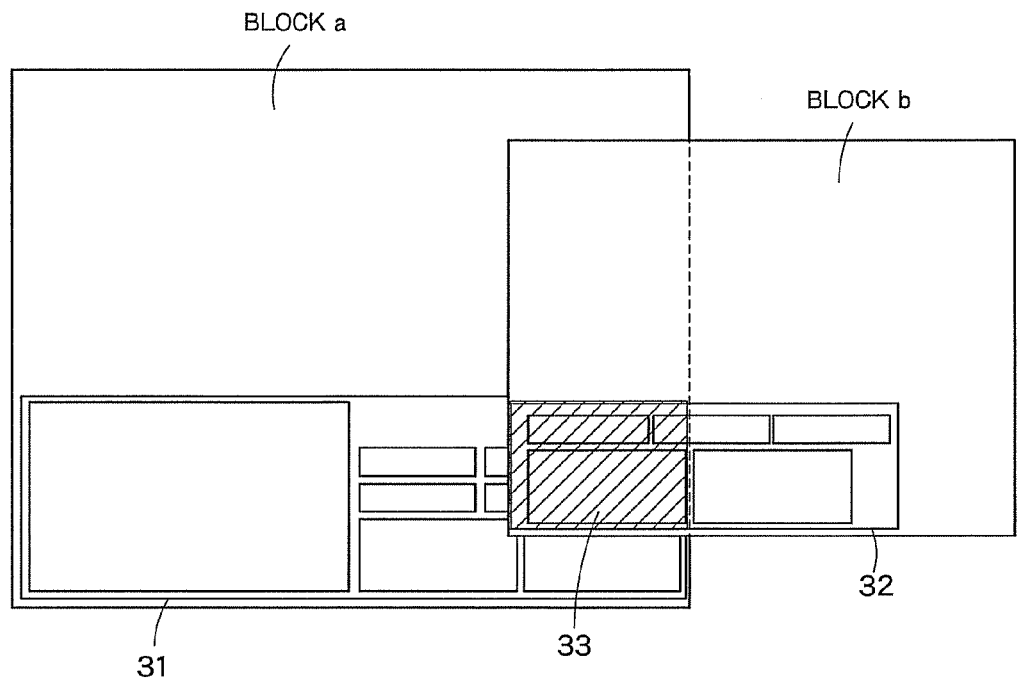
F I G. 11
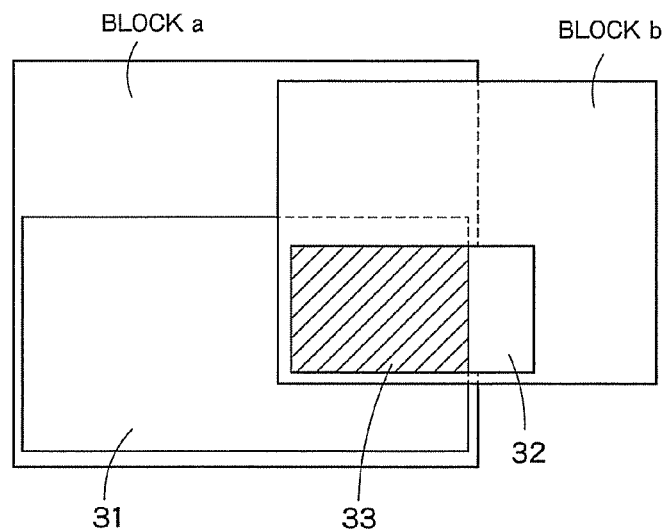
F I G. 12

SEMICONDUCTOR LAYOUT DESIGN APPARATUS, SEMICONDUCTOR LAYOUT DESIGN METHOD AND COMPUTER READABLE MEDIUM

CROSS REFERENCE TO RELATED APPLICATIONS

This application is based upon and claims the benefit of priority from the prior Japanese Patent Application No. 2006-312007, filed on Nov. 17, 2006, the entire contents of which are incorporated herein by reference.

BACKGROUND OF THE INVENTION

1. Field of the Invention

The present invention relates to a semiconductor layout design apparatus, a semiconductor layout design method and a computer readable medium which places macrocells in a placement region on a semiconductor substrate.

2. Related Art

In today's most LSI designs, many macrocells are used, which are typically placed manually by engineers. The placement of macrocells is performed after placing input/output elements and roughly placing blocks. After macrocells are placed, optimization of the placement is performed, which significantly changes the placement of the roughly placed blocks. Therefore, after the optimization of the placement, the placements of the blocks and macrocells must be adjusted again. Typically, this adjustment work is also manually performed by engineers. Thus, there is a problem that the qualities of eventual floor plans vary depending on the way to adjust (see Japanese Patent Laid-Open No. 06-244280 and No. 2006-190062).

Another problem with the conventional LSI design is that it takes long time before the final placement of macrocells is determined by the adjustment work, which leads to a high number of man-hours and costs for design.

SUMMARY OF THE INVENTION

According to one aspect of the present invention, a semiconductor layout design apparatus comprising:

an inter-block connection information extracting part configured to extract the number of wiring connections between a plurality of blocks including standard cells and macrocells based on a net list, library information, floor plan information and technology information;

a block global placement part configured to roughly place the plurality of blocks in a placement region on a semiconductor substrate; and a cell placement setting part configured to set placement positions of the macrocells in the block based on a positioning relationship with the other block and the number of the wiring connections with the other block with respect to each of the plurality of blocks roughly placed by the block global placement part.

According to one aspect of the present invention, a semiconductor layout design method comprising:

extracting the number of wiring connections between a plurality of blocks including standard cells and macrocells based on a net list, library information, floor plan information and technology information;

roughly placing the plurality of blocks in a placement region on a semiconductor substrate; and setting placement positions of the macrocells in the block based on a positioning relationship with the other block and the number of the wiring connections with the other block with respect to each of the roughly placed plurality of blocks.

According to one aspect of the present invention, a computer readable medium storing a computer program code, the computer program code making a computer executing:

extracting the number of wiring connections between a plurality of blocks including standard cells and macrocells based on a net list, library information, floor plan information and technology information;

roughly placing the plurality of blocks in a placement region on a semiconductor substrate; and setting placement positions of the macrocells in the block based on a positioning relationship with the other block and the number of the wiring connections with the other block with respect to each of the roughly placed plurality of blocks.

BRIEF DESCRIPTION OF THE DRAWINGS

FIG. 1 is a block diagram schematically showing a configuration of a semiconductor layout design apparatus according to a first embodiment of the present invention;

FIG. 3 is a diagram showing a force line vector between blocks "a" and "b";

FIG. 4 is a diagram illustrating a composite force line vector;

FIG. 5 is a diagram showing an example in which macrocells are placed along the shorter side (in the y-axis direction);

FIG. 6 is a diagram showing an example in which macrocells are placed along the longer side (in the x-axis direction);

FIG. 7 is a diagram showing an example in which macrocells are placed in L-shape;

FIG. 8 is a flowchart of a procedure performed by a semiconductor layout design apparatus according to a second embodiment;

FIG. 10A is a diagram showing positions of macrocells placed in a block resulting from the processing from step S31 to S41; FIG. 10B is a diagram showing a macro placement region;

FIG. 11 is a diagram showing an example in which a macro placement region 31 of block "a" overlaps a macro placement region 32 of block "b";

FIG. 12 is a diagram showing an example in which a portion of the macro placement region of block "a" overlaps the macro placement region of block "b";

DETAILED DESCRIPTION OF THE INVENTION

Figure 2:
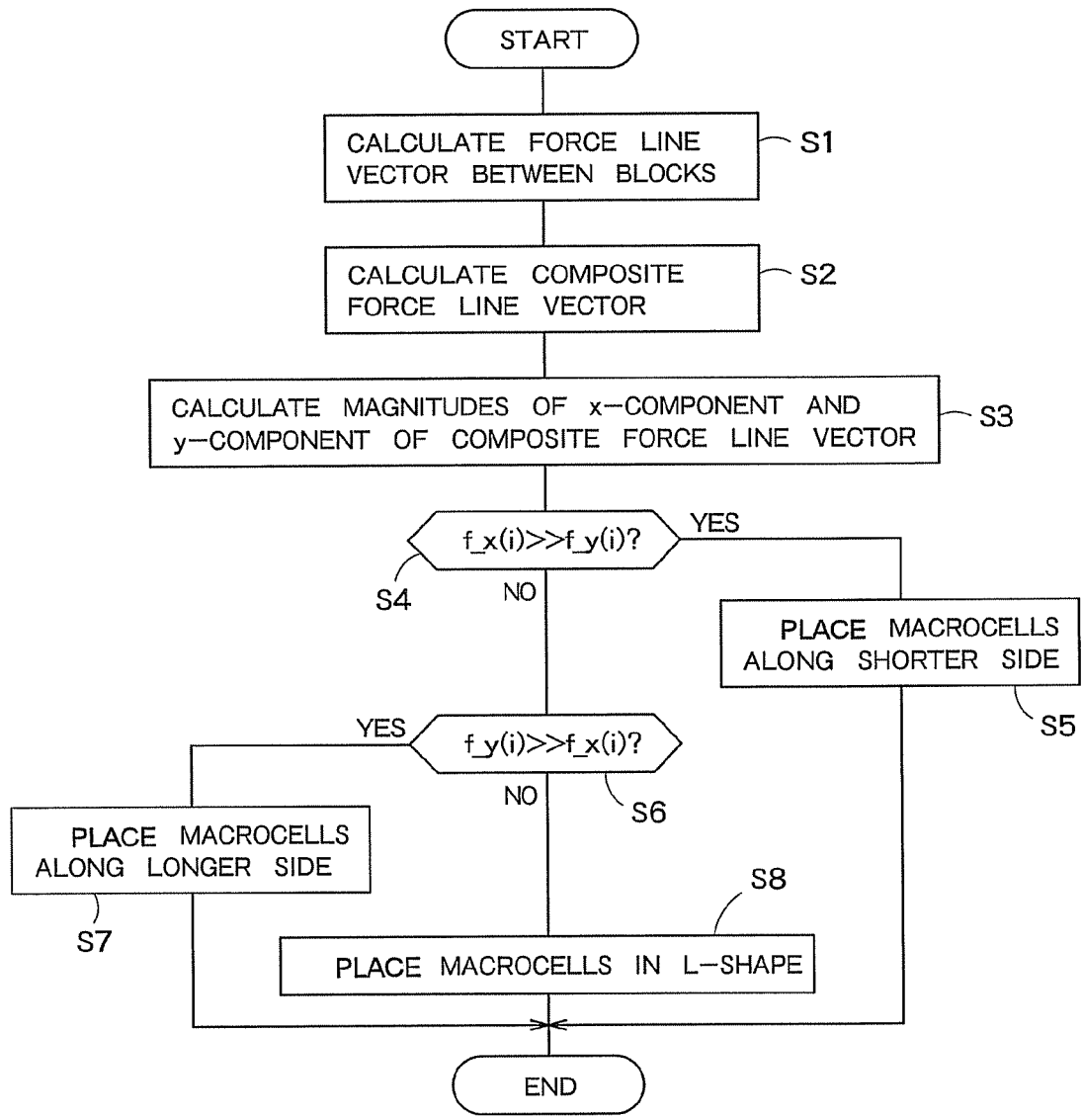
FIG. 2 is a flowchart of a detailed procedure for placing macrocells performed in the semiconductor layout design apparatus shown in FIG. 1.

Embodiments of the present invention will be described with reference to the accompanying drawings.

First Embodiment

FIG. 1 is a block diagram schematically showing a configuration of a semiconductor layout design apparatus according to a first embodiment of the present invention. The semiconductor layout design apparatus shown in FIG. 1 includes a processor 1, a display device 2, a net list memory device 3, a library information memory device 4, a floor plan information memory device 5, a technology information memory device 6, and a floor plan evaluation result memory device 7. The processor 1 and memory devices are interconnected through a network line 8. The processor 1 sends and receives various kinds of data to and from the memory devices through the network line 8. The memory devices may be connected onto an internal bus or external bus of the processor 1 instead of the network line 8.

The processor 1 includes an interface part 11, an inter-block connection information extracting part 12, a block global placement part 13, a cell placement setting part 14, a force line vector generating part 15, a vector combining part 16, a macro placement region extracting part 17, an overlap determining part 18, an overlap eliminating part 19, and a replacement part 20.

The interface part 11 performs processing for retrieving a net list stored in the net list memory device 3, library information stored in the library information memory device 4, floor plan information stored in the floor plan memory device 5, and technology information stored in the technology information memory device 6, and processing for sending the result of evaluation of a floor plan to the floor plan evaluation result memory device 7.

A net list is data describing information about connections of semiconductor circuits formed on a semiconductor substrate. Library information is circuit information such as standard cells, macrocells and gates that can be placed in a placement region. Floor plan information indicates what kind of standard cells and macrocells are placed on each floor plan. Technology information is information such as the widths of lines placed in a placement region and signal propagation delay times.

The inter-block connection information extracting part 12 extracts the number of wiring connections between blocks. The term "block" as used herein refers to a region containing multiple standard cells and macrocells logically related to each other. Multiple blocks are placed in a placement region.

The cell placement setting part 14 sets positions in each of multiple blocks where macrocells are to be placed, on the basis of the positional relationship with other blocks and the number of wiring connections to other blocks.

The force line vector generating part 15 generates a force line vector pointing from a representative point of a subject block to a representative point of another block and having a magnitude that is equal to the distance to another vector multiplied by the number of wiring connections to the other block.

The vector combining part 16 combines force line vectors from a subject block to other blocks if there are two or more blocks connected with the subject block through wiring connections.

The macro placement region extracting part 17 extracts a macro placement region representing a range including all macrocells set by the cell placement setting part 14 for each of the multiple blocks.

The overlap determining part 18 determines whether macro placement regions of blocks at least partially overlap each other.

If the overlap determining part 18 determines that macro placement regions overlap each other, the overlap eliminating part 19 moves or resizes the overlapping macro placement regions in order to eliminate the overlap.

If an overlap of macro placement regions is not eliminated after the overlap eliminating part 19 performs the process for eliminating the overlap a predetermined times, the replacement part 20 replaces the positions of macrocells in the block.

It should be noted that the force line vector generating part 15, the vector combining part 16, the macro placement region extracting part 17, the overlap determining part 18, the overlap eliminating part 19, and the replacement part 20 are not essential for the embodiment and therefore can be omitted.

FIG. 2 is a flowchart showing a detailed procedure for placing macrocells performed in the semiconductor layout design apparatus shown in FIG. 1. Before performing the procedure in the flowchart, the block global placement part 13 roughly places blocks.

First, the force line vectors between blocks are calculated (step S1). FIG. 3 shows a force line vector between blocks "a" and "b" as an example. In FIG. 3, the line vector pointing from a representative point of block "a" to a representative point of block "b" is defined as the force line vector. The force line vector can be expressed by the following Equation (1).

$$\overrightarrow{f(a,b)} \tag{1}$$

The representative point of a block here may be the center point of the block or, if the placement of cells in the block has been determined, the barycentric position of the cell placement. If the distance between the representative points of blocks "a" and "b" is denoted by Dist(a,b) and the number of wiring connections between blocks "a" and "b" is denoted by Conn(a,b), the magnitude of the force line vector between the blocks can be expressed by the following Equation (2).

$$|\overrightarrow{f(a,b)}|=\text{Dist}(a,b)*\text{Conn}(a,b) \tag{2}$$

The distance between the blocks Dist(a,b) and the number of wiring connections between the blocks Conn(a,b) in Equation (2) may be weighted in accordance with the density of cells placed in the blocks and the crowdedness of the wiring connections between the blocks. For example, a block may be divided into grid squares, the cell density of each grid square may be calculated and the distance Dist(a,b) may be weighted with the cell density of each grid square when the distance Dist(a,b) is calculated.

If there are force line vectors pointing from a block (of interest) "i" to multiple other blocks, a force line vector into which these force line vectors are combined (hereinafter referred to as a composite force line vector) is calculated (step S2). This processing is performed by the vector combining part 16 shown in FIG. 1.

For example, the force line vector of block "i" in FIG. 4 is a composite vector into which the force line vector pointing from block "i" to block "a" and the force line vector pointing from block "i" to block "b" are combined. The composite force line vector of block "i" can be expressed by the following equation (3).

$$\overrightarrow{f(i)}=\overrightarrow{f(i,a)}+\overrightarrow{f(i,b)} \tag{3}$$

In this way, the composite force line vector of block "i" is expressed by the sum of the force line vectors between the block "i" and the other blocks. Equation (3) can be generalized as follows. If it is assumed that there is the force line vectors going from block "i" to "n" other blocks, the composite force line vector of block "i" can be expressed by the following Equation (4).

$$\overrightarrow{f(i)} = \sum_{k=1}^{n} \overrightarrow{f(i,k)} \tag{4}$$

Then, the magnitudes of the x-component and y-component of the composite force line vector of block "i" are calculated (step S3).

For example, the magnitude of the x-component of the composite force line vector of block "i" represented by Equation (4) is f_x(i) and the magnitude of the y-component is f_y(i) in FIG. 4.

Then, determination is made as to whether the magnitude f_x(i) of the x-component is significantly greater than the magnitude f_y(i) of the y-component (step S4). More specifically, the determination is made as to whether the magnitude f_x(i) of the x-component is at least a predetermined threshold value greater than the magnitude f_y(i) of the y-component If the determination at step S4 is affirmative, macrocells are placed along the shorter side (y-axis) of block "i" as shown in FIG. 5 so that connections in the direction of the longer side (x-axis) of block "i" are not prevented. The macrocells are placed in such a manner that they do not overlap each other (step S5).

FIG. 5 shows an example in which macrocells A, B, C, and D are placed along the shorter side. Macrocells A to D are placed along the shorter side of block "i" on the side that is closer to the origin of the x-axis component vector of the composite force line vector than the destination of the x-axis component vector.

If the magnitude f_x(i) of the x-component of the composite force line vector is significantly greater than the magnitude f_y(i) of the y-component in this way, the distance between the blocks or the number of wiring connections between the blocks in the x-axis direction is likely to be great. Therefore, macrocells are preferably placed in the y-axis direction rather than the x-axis direction.

On the other hand, if the determination at step S4 of FIG. 2 is negative, determination is made as to whether the magnitude f_x(i) of the x-component of the composite force line vector is significantly smaller than the magnitude f_y(i) of the y-component (step S6). More specifically, the determination is made as to whether the magnitude f_x(i) of the x-component of the composite force line vector is at least a predetermined threshold value smaller than the magnitude f_y(i) of the y-component (step S6).

If the determination at step S6 is affirmative, the macrocells A to D are placed along the longer side (x-axis) of block "i" as shown in FIG. 6 so as not to prevent connections along the shorter side (y-axis). The macrocells are placed in such a manner that they do not overlap each other (step S7). More specifically, the macrocells are placed along the longer side of block "i" on the side that is closer to the origin of the y-axis component vector of the composite force line vector than the destination of the y-axis component vector.

If the magnitude f_y(i) of the y-component of the composite force line vector is significantly greater than the magnitude f_x(i) of the x-component in this way, the distance between the blocks is likely to be long in the y-axis direction or the number of wiring connections between the blocks in the y-axis direction is likely to be great. Therefore, macrocells are preferably placed in the x-axis direction rather than the y-axis direction.

On the other hand, if the determination at step 6 is negative, it indicates that the magnitude f_x(i) of the x-component of the composite force line vector is approximately equal to the magnitude f_y(i) of the y-component. In this case, the macrocells A to D are placed along the x-axis and y-axis of block "i" in L-shape as shown in FIG. 7 (step S8). The macrocells are placed in such a manner that they do not overlap each other. More specifically, the macrocells are placed along the longer and shorter sides of block "i" on the side that is closer to the origins of the x-axis and y-axis component vectors than the destinations of the vectors.

In this way, if the magnitude f_x(i) of the x-component of the composite force line vector and the magnitude f_y(i) of the y-component are approximately equal to each other, macrocells are placed evenly along the x-axis and y-axis directions so that the cell densities in both directions are equalized.

As a result of the processing described above, macrocells can be placed in block "i". Similar processing is performed for the other blocks.

According to the first embodiment, force line vectors pointing from each block to other blocks are obtained and a composite force line vector is calculated. The magnitudes of the x-component and y-component of the composite force line vector are compared with each other and placement of the macrocells in the block is determined on the basis of the result of the comparison. Thus, the macrocells can be placed efficiently in such a manner that the macrocells do not prevent other wiring. Consequently, the frequency of substantial rewiring of macrocells is reduced and therefore the number of man-hours and costs of design can be reduced.

Second Embodiment

In a second embodiment, placement of macrocells is automated and the macrocells are placed in such a manner that the macrocells in the blocks do not overlap each other.

The semiconductor layout design apparatus according to the second embodiment has a block configuration similar to that shown in FIG. 1 and therefore the following description will focus on differences from the first embodiment.

FIG. 8 is a flowchart showing a procedure performed by the semiconductor layout design apparatus according to the second embodiment. First, a net list, library information, floor plan information, and technology information are obtained and then input and output elements are placed in a placement region (step S11). The processing at step S11, which is conventional processing, is performed by the processor 1 shown in FIG. 1. An inter-block connection information extracting part 12 extracts information about connections between blocks containing standard cells and macrocells (more specifically, the number of wiring connections) (step S12). The processor 1 executes an automatic place and route (P & R) tool to roughly place the standard cells and macrocells in the placement region (step S13). The purpose of the global placement is to determine the relative positions of blocks that provide short wiring line lengths. The macrocells are not fixed in the automatic placement so that the P & R tool can optimize the relative positions of the blocks. Step S13 is performed by the block global placement part 13 shown in FIG. 1.

The processor 1 then performs macrocell placement in the placement region (step S14). The processing at step S14 will be detailed later. The processor 1 performs initial placement of the standard cells on each candidate floor plan created (S15).

The processor 1 calculates the evaluation values of the floor plans and selects a floor plan whose evaluation value is the smallest (step S16).

The processor 1 performs optimization of the initial placement of the standard cells on the floor plan selected at step S16, such as adjustment of cell placement and cell driving performance, improvement of the number of gates, and insertion of buffer cells, and performs timing improvement processing (step S17).

The processor 1 verifies the wiring and timing performance on the floor plan optimized at step S17 (step S18). If a problem with wiring and timing performance is found as a result of the verification, the process returns to step S14 and placement of the macrocells is performed again. On the other hand, if no problem is found as a result of the verification, the processing of FIG. 8 will end with determining the floor plan.

Figure 9:
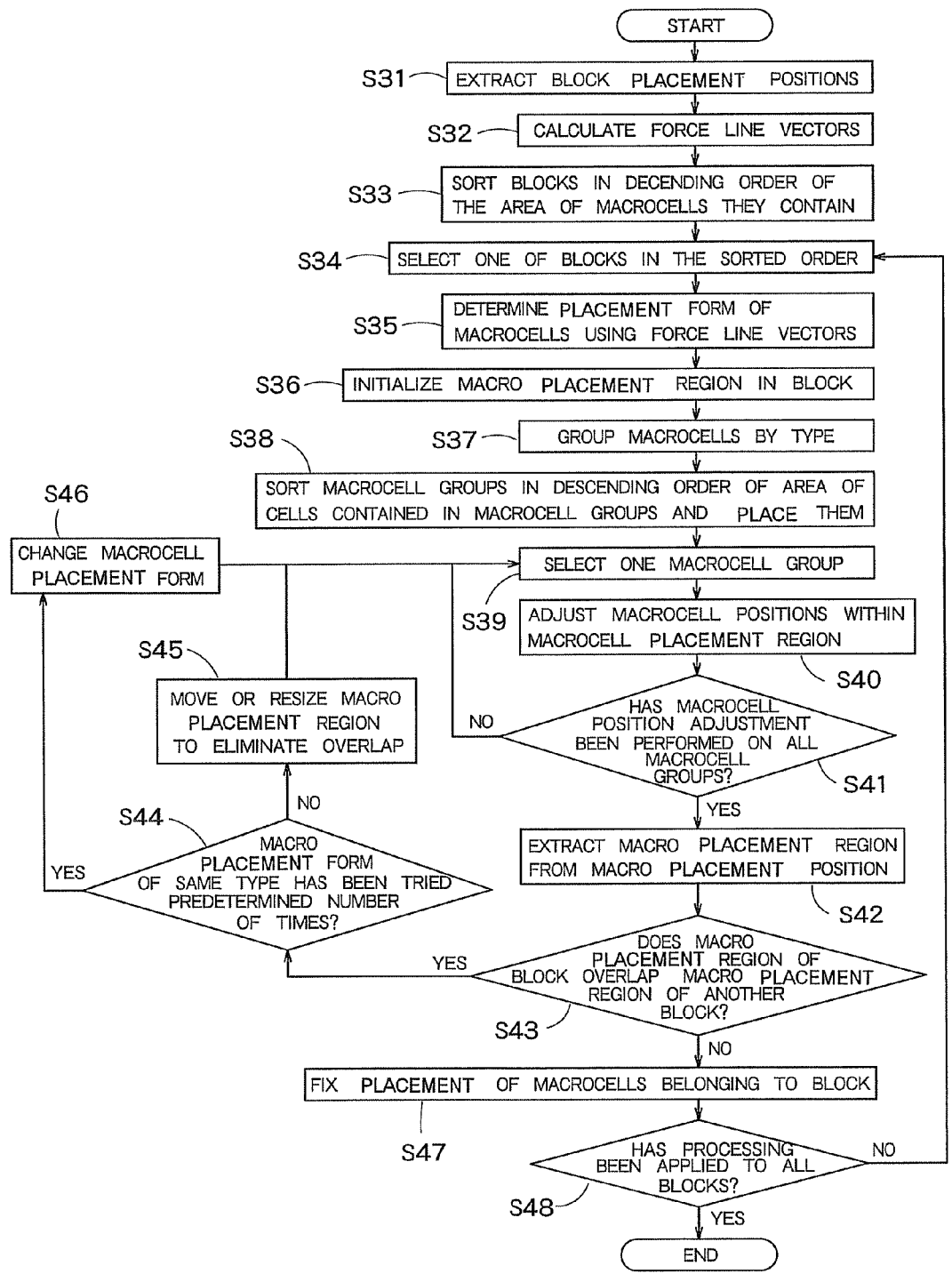
FIG. 9 is a flowchart showing in detail an exemplary procedure at step S14 of FIG. 8.
Figure 13A:
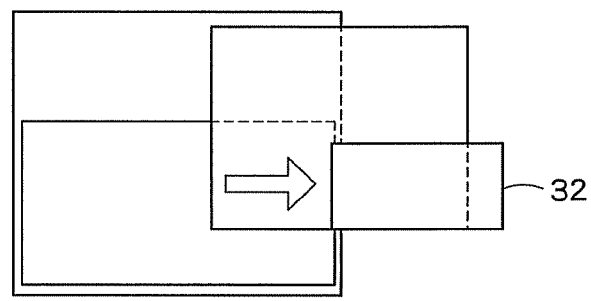
FIGS. 13A to 13D are diagrams showing examples of how a macro placement region is moved.
Figure 13B:
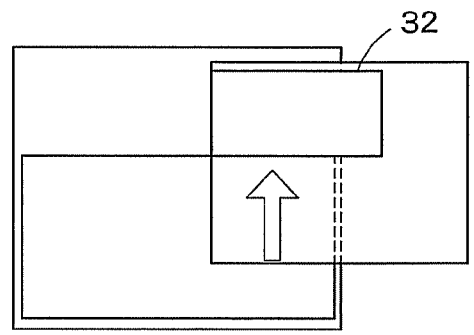
Figure 13C:
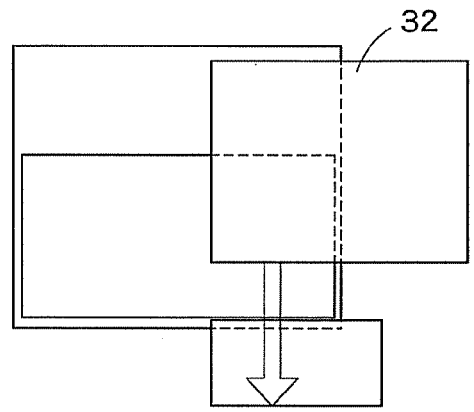
Figure 13D:
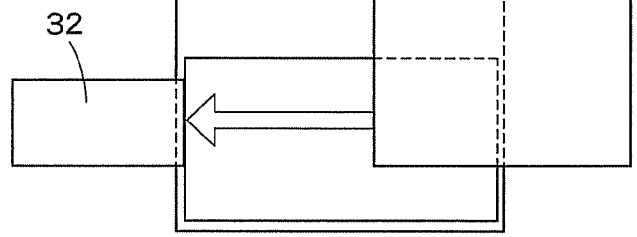

FIG. 9 is a flowchart showing an exemplary detailed procedure performed at step S14 of FIG. 8. In the process in the flowchart, macrocells are placed in such a manner that they do not overlap each other.

First, the placement positions of blocks are extracted (step S31). The coordinates of a representative point of each block are first calculated at step S31. The representative point may be the center point of the block, for example. If the minimum and maximum x-coordinates are denoted by $x_{min}$ and $x_{max}$, respectively, and the minimum and maximum y-coordinates are denoted by $y_{min}$ and $y_{max}$, respectively, among the center coordinates (x, y) of the macrocells that belong to the block, then the center coordinates (x, y) of each macrocell can be represented by the following Equation (5).

$$c(x,y)=((x_{min}+x_{max})/2,(y_{min}+y_{max})/2) \quad (5)$$

Here, the representative point of a block may be the center or barycenter of the block or the average coordinate position of the macrocells belonging to the block. If the number of macrocells is denoted by "n" and the center coordinates of each macrocell are denoted by $(x_i, y_i)$, the average coordinates A (x, y) of the macrocells can be represented by $$A(x,y)=(\Sigma x_i/n, \Sigma y_i/n) \quad (6)$$

Alternatively, the representative point may be the average position of the coordinates of the macrocells belonging to the block. If the number of cells belonging to a block is denoted by "n", the center coordinates of each macrocell are denoted by $(x_i, y_i)$, and the area of each macrocell is denoted by ai, then the barycentric coordinates G(x, y) of the block can be calculated by the following Equation (7).

$$G(x,y)=(\Sigma(x_i*a_i)/\Sigma a_i, \Sigma(y_i*a_i)/\Sigma a_i) \quad (7)$$

If the areas of the macrocells in a block significantly vary from macrocell to macrocell or if the macrocells are distributed over a block, it may be effective to use the barycenter of the block as the representative point.

After the coordinates of the representative point of the block are calculated in the procedure described above, the position and region where each block is placed are determined. If the representative point of a block is denoted by $(x_{rep}, y_{rep})$, the minimum and maximum x-coordinates among the center coordinates of the macrocells in the block are denoted by $x_{min}$ and $x_{max}$, respectively, and the minimum and maximum y-coordinates are represented by $y_{min}$ and $y_{max}$, respectively, then the coordinates $(x_{ll}, y_{ll})$ of the lower left corner of a rectangular placement region in the block and the coordinates $(x_{ur}, y_{ur})$ of the upper right corner of the region can be expressed by the Equations (8) to (11).

$$x_{ll}=x_{rep}+(x_{min}-x_{rep})/2 \quad (8)$$

$$y_{ll}=y_{rep}+(y_{min}-y_{rep})/2 \quad (9)$$

$$x_{ur}=x_{rep}+(x_{max}-x_{rep})/2 \quad (10)$$

$$y_{ur}=y_{rep}+(y_{max}-y_{rep})/2 \quad (11)$$

As a result of the procedure above, the positions where the blocks are placed are extracted at step S31.

After the completion of the processing at step S31, the force line vector of each block is calculated (step S32). At step S32, the force line vectors are calculated in the same way as that at step S1 of FIG. 2.

Then, the sizes of the macrocells in the blocks are compared with one another and the blocks are sorted in descending order of the size of macrocells contained in the blocks, for example (step S33). Then the block at the top of the sorted list is selected (step S34).

A macrocell placement form is set in the block selected at step S34 according to the same procedure as that of the first embodiment (the flowchart in FIG. 2) (step S35). Then, macrocells are placed in the block as the initial placement (step S36).

The macrocells are classified into groups according to their types (for example sizes) (step S37). The macrocell groups are sorted in descending order (step S38). The macrocell groups are selected one by one in the sorted order (step S39).

The position of each macrocell placed in the macrocell group selected at step S39 among the macrocells initial-placed at step S36 is adjusted (step S40). Then, determination is made as to whether macrocell position adjustment has been performed on all macrocell groups (step S41). If there is a macrocell group that has not been adjusted, the process returns to step S39; otherwise, a macro placement region containing all macrocells placed in the placement region is extracted (step S42).

For example, FIG. 10A shows positions of the macrocells in a block obtained as a result of the processing from step S31 to S41. Macrocells m1, m2, and m3 in FIG. 10A belong to macrocell group G1, macrocells m4, m5, m6, and m7 belong to macrocell group G2, and macrocells m8, m9, and m10 belong to macrocell group G3.

A macro placement region containing all macrocells m1 to m10 in FIG. 10A is extracted at step S42 described above. For example, a rectangular region 31 containing all macrocells m1 to m10 is extracted as the macro placement region as shown in FIG. 10B.

Then, determination is made as to whether the macro placement region extracted at step S42 overlaps a macro placement region of another block (step S43). FIG. 11 shows an example in which the macro placement region 31 of block "a" overlaps the macro placement region 32 of block "b". In FIG. 11, the overlapping region is indicated by reference numeral 33.

If it is determined at step S43 that the macro placement regions overlap with each other, determination is made as to whether the processing for determining whether macro placement regions overlap has been performed a predetermined number of times (step S44). If the determination at step S44 is negative, macro placement regions are moved or resized in order to eliminate the overlap (step S45).

FIGS. 12 and 13 illustrate an example of an overlap between macro placement regions detected and an example of how macro placement regions are moved. FIG. 12 shows an example in which a portion of the macro placement region of block "a" overlaps the macro placement region of block "b". This overlap can be eliminated by moving the macro placement region 32 in block "b" to the right as shown in FIG. 13A, or by moving the macro placement region 32 upward as shown in FIG. 13B, or by moving the macro placement region 32 downward as shown in FIG. 13C, or by moving the macro placement region 32 to the left as shown in FIG. 13D.

One of the four ways shown in 13A to 13D that eliminates the overlap with the minimum distance of movement is eventually selected and the macro placement region is moved.

FIG. 14, on the other hand, illustrates processing for resizing a macro placement region at step S45 described above. In the example shown in FIG. 14, three blocks "a", "b", and "c" are placed adjacently to each other and the positions of the macro placement regions in blocks "a" and "c" are fixed. In the initial state, the macro placement region 31 in block "a" partially overlaps the macro placement region 32 in block "b" as shown in FIG. 14A. Therefore, the macro placement region 32 in block "b" is moved to the right in the example shown in FIG. 14B. As a result, the macro placement region 32 in block "b" partially overlaps the macro placement region 34 in block "c".

Figure 14A:
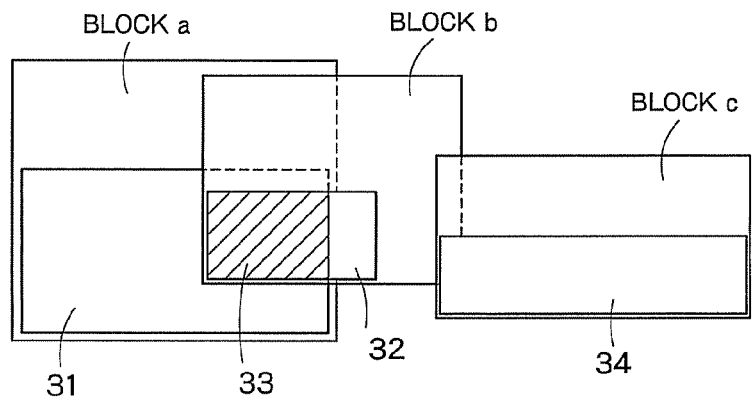
FIG. 14A to 14D are diagrams illustrating processing for resizing a macro placement region at step S45.
Figure 14B:
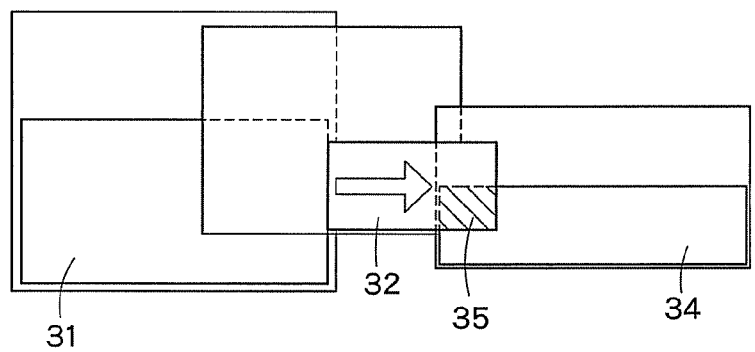
Figure 14C:
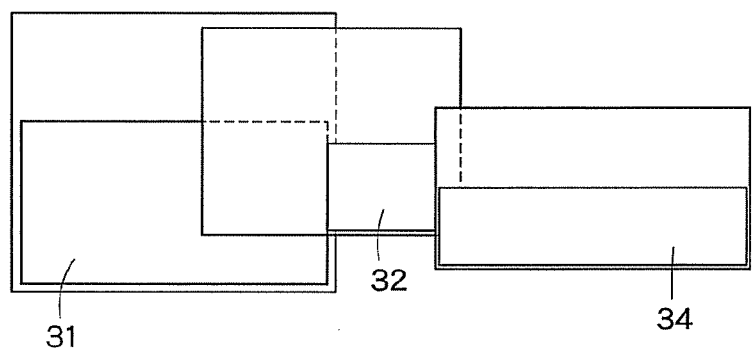

Therefore, the macro placement region 32 in block "b" is compressed (reduced) in size as shown in FIG. 14C so that the macro placement region 32 does not overlap the macro placement regions 31, 34 in blocks a, c. More specifically, the macro placement region 32 is compressed in the direction opposite to the direction of movement in FIG. 14B so that the macro placement region 32 does not overlap the macro placement regions 31 and 34 on both sides.

Figure 14D:
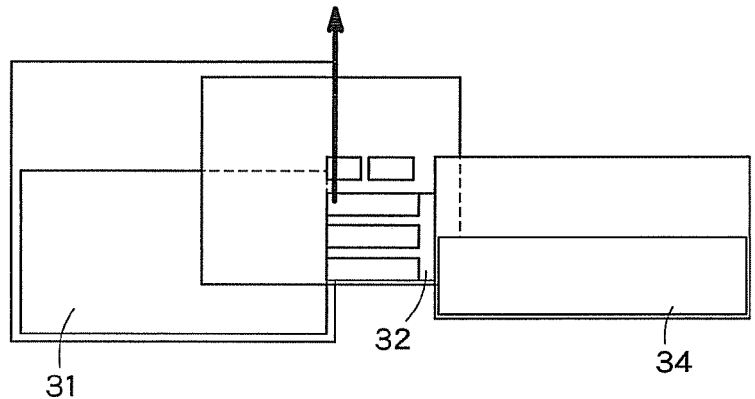

FIG. 14D shows an example in which macrocells are placed in the macro placement region 32 compressed in FIG. 14C. Some of the macrocells are placed outside the macro placement region 32. This is because the embodiment permits macrocells to be placed beyond a macro placement region in the direction parallel with the force line vector of a block.

After step S45 of FIG. 9 is completed in accordance with the procedure described above, the process returns to step S39, where a macrocell group in the placement region is selected. Then steps S40 to S43 are performed again in sequence.

On the other hand, if the determination at step S44 is negative, that is, the processing for determining whether there is an overlap between placement regions is made the predetermined number of times, it is determined that the overlap cannot be eliminated with the current macrocell placement, and the processing for changing the form of placement of the macrocells is performed (step S46).

The placement form of macrocells is determined by the magnitudes and directions of force line vectors as described with respect to the first embodiment. For example, if macrocells are placed as shown in FIG. 5 by the processing at step S35 of FIG. 9 but the overlap between macro placement regions cannot be eliminated, a macrocell placement form as shown in FIG. 6 or 7 is chosen.

After the completion of step S46, the process returns to step S39, and steps S39 to S43 are performed again in sequence.

On the other hand, if determination at step S43 is negative, that is, the macro placement region of the block does not overlap another macro placement region, then the positions of the macrocells in the block are fixed (step S47).

Then, determination is made as to whether the processing from step S34 to S47 has been performed for all blocks (step S48). If there are blocks that have not yet been subjected to the processing, the process returns to step S34, where the next block yet to be processed in the sorted blocks is selected and the processing from step S35 to S47 is performed on the block.

As has been described, according to the second embodiment, determination is made on the basis of force line vectors as to whether a portion of a macro placement region in a block overlaps a macro placement region in another block, and a macro placement region is moved or resized to eliminate an overlap. Thus, the need for engineers to manually adjust macrocells is eliminated and therefore the number of manhours and costs required for design can be reduced.

The processor 1 shown in FIG. 1 may be implemented by a single computer or multiple computers. The parts 11 to 18 contained in the processor 1 may be implemented by hardware or software. If any of the parts are implemented by software, a computer may be caused to read and execute a program that performs processing and operation of the parts 11 to 18.

What is claimed is:

1. A semiconductor layout design apparatus comprising:
   an inter-block connection information extracting part configured to extract a number of wiring connections between a plurality of blocks including standard cells and macrocells based on a net list, library information, floor plan information and technology information;
   a block global placement part configured to roughly place the plurality of blocks in a placement region on a semiconductor substrate; and
   a cell placement setting part configured to set placement positions of the macrocells in a subject block based on a positioning relationship between the subject block and another block and a number of the wiring connections between the subject block and said another block, the subject block being each of the plurality of blocks roughly placed by the block global placement part.

2. The semiconductor layout design apparatus according to claim 1 further comprising:
   a force line generating part configured to generate a force line vector which has a direction pointing from a representative point of the subject block to a representative point of said another block and has a magnitude of a multiplied value obtained by multiplying a distance from the subject block to said another block by the number of wiring connections between the subject block and said another block,
   wherein the cell placement setting part sets, the placement positions of the macrocells in the subject block based on a result of comparing magnitudes in two axes directions of the force line vector.

3. The semiconductor layout design apparatus according to claim 2 further comprising:
   a vector combining part configured to combine force line vectors pointing from the subject block to each of other blocks when there are two or more blocks connected to the subject block,
   wherein the cell placement setting part sets the placement positions of the macrocells in the subject block based on a result of comparing magnitudes in two axes directions of a composite force line vector combined by the vector combining part.

4. The semiconductor layout design apparatus according to claim 3,
   wherein when a magnitude in a first direction of the composite force line vector is larger than a magnitude in a second direction of the composite force line vector by a predetermined value or more, the cell placement setting part places the macrocells along the second direction, and when the magnitude in the second direction is larger than the magnitude in the first direction by a predetermined value or more, the cell placement setting part places the macrocells along the first direction.

5. The semiconductor layout design apparatus according to claim 3,
   wherein when a magnitude in a first direction of the composite force line vector is substantially equal to a magnitude in a second direction of the composite force line vector, the cell placement setting part places the macrocells equally in the first and second directions.

6. The semiconductor layout design apparatus according to claim 2,
   wherein a representative point of the subject block is at a center or a barycenter of the subject block.

7. The semiconductor layout design apparatus according to claim 2,
wherein the subject vector generating part calculates the multiplied value obtained by weighing at least one of the distance between the subject block and said another block and the number of wiring connections between the subject block and said another block by a cell placement density in the subject block or the number of the wiring connections.

8. The semiconductor layout design apparatus according to claim 1, further comprising:
a macro placement region extracting part configured to extract a macro placement region indicative of a range including all the macrocells set by the cell placement setting part for each of the plurality of blocks;
an overlap determining part configured to determine whether at least a part of the macro placement regions in the blocks overlaps; and
an overlap eliminating part configured to move an overlapped macro placement region or resize an overlapped macro placement region in order to eliminate an overlapping when the overlap determining part determines that the overlapping exists.

9. The semiconductor layout design apparatus according to claim 8, further comprising:
a cell replacement setting part configured to reset the placement positions of the macrocells in the block when the overlapping of the macro placement regions is not eliminated even if the processing of the overlap eliminating part is performed a predetermined number of times.

10. A semiconductor layout design method comprising:
extracting, by an inter-block connection information extracting part, a number of wiring connections between a plurality of blocks including standard cells and macrocells based on a net list, library information, floor plan information and technology information;
roughly placing, by a block global placement part, the plurality of blocks in a placement region on a semiconductor substrate; and
setting, by a cell placement setting part, placement positions of the macrocells in a subject block based on a positioning relationship between the subject block and another block and a number of the wiring connections between the subject block and said another block, the subject block being each of the roughly placed plurality of blocks.

11. The semiconductor layout design method according to claim 10 further comprising:
generating, by a force line generating part, a force line vector which has a direction pointing from a representative point of the subject block to a representative point of said another block and has a magnitude of a multiplied value obtained by multiplying a distance from the subject block to said another block by a number of wiring connections between the subject block and said another block,
wherein the placement positions of the macrocells in the subject block are set based on a result of comparing magnitudes in two axes directions of the force line vector.

12. The semiconductor layout design method according to claim 11 further comprising:
combining, by a vector combining part, force line vectors pointing from the subject block to each of other blocks when there are two or more blocks connected to the subject block,
wherein the placement positions of the macrocells in the subject block are set based on a result of comparing the magnitude in two axes directions of a composite force line vector combined by the vector combining part.

13. The semiconductor layout design method according to claim 12,
wherein when a magnitude in a first direction of the composite force line vector is larger than a magnitude in a second direction of the composite force line vector by a predetermined value or more, the macrocells are set along the second direction, and when the magnitude in the second direction is larger than the magnitude in the first direction by a predetermined value or more, the macrocells are set along the first direction.

14. The semiconductor layout design method according to claim 12,
wherein when a magnitude in a first direction of the composite force line vector is substantially equal to a magnitude in a second direction of the composite force line vector, the macrocells are equally placed in the first and second directions.

15. The semiconductor layout design method according to claim 11,
wherein a representative point of the subject block is at a center or a barycenter of the subject block.

16. The semiconductor layout design method according to claim 11,
wherein the multiplied value is obtained by weighing at least one of the distance between the subject block and said another block and the number of wiring connections between the subject block and said another block by a cell placement density in the subject block or the number of the wiring connections.

17. The semiconductor layout design method according to claim 10, further comprising:
extracting, by a macro placement region extracting part, a macro placement region indicative of a range including all the set macrocells for each of the plurality of blocks;
determining, by an overlap determining part, whether at least a part of the macro placement regions in the blocks overlaps; and
performing, by an overlap eliminating part, an overlap eliminating process which moves an overlapped macro placement region or resizes the overlapped macro placement region in order to eliminate an overlapping when it is determined that the overlapping exists.

18. The semiconductor layout design method according to claim 17, further comprising:
resetting, by a cell replacement setting part, the placement positions of the macrocells in the block when the overlapping of the macro placement regions is not eliminated even if the processing of the overlap eliminating process is performed a predetermined number of times.

19. A computer readable medium storing a computer program code, the computer program code causing a computer to execute:
extracting a number of wiring connections between a plurality of blocks including standard cells and macrocells based on a net list, library information, floor plan information and technology information;
roughly placing the plurality of blocks in a placement region on a semiconductor substrate; and
setting placement positions of the macrocells in a subject block based on a positioning relationship between the subject block and another block and a number of the wiring connections between the subject block and said another block, the subject block being each of the roughly placed plurality of blocks.

20. The medium according to claim 19, the computer program code making a computer further executing:

generating a force line vector which has a direction pointing from a representative point of the subject block to a representative point of said another block and has a magnitude of a multiplied value obtained by multiplying a distance from the subject block to said another block by the number of wiring connections between the subject block and said another block, wherein the placement positions of the macrocells in the subject block is set based on a result of comparing magnitudes in two axes directions of the force line vector.

* * * * *